United States Patent
Ohashi (12)

(10) Patent No.: US 6,489,860 B1
(45) Date of Patent: Dec. 3, 2002

(54) SURFACE ACOUSTIC WAVE DUPLEXER WITH FIRST AND SECOND PACKAGE GROUND PATTERNS

(75) Inventor: Wataru Ohashi, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 9 days.

(21) Appl. No.: 09/667,803

(22) Filed: Sep. 22, 2000

(30) Foreign Application Priority Data

May 29, 2000 (JP) ........................................ 2000-157563

(51) Int. Cl.[7] .............................. H03H 9/72; H03H 9/64
(52) U.S. Cl. ........................................ 333/133; 333/193
(58) Field of Search .......................... 333/133, 193–196

(56) References Cited

U.S. PATENT DOCUMENTS 5,561,406 A * 10/1996 Ikata et al. .............. 333/193 X
5,859,473 A * 1/1999 Ikata et al. .............. 333/193 X
6,150,904 A * 11/2000 Taniguchi et al. .......... 333/193

FOREIGN PATENT DOCUMENTS

JP        2000-68785       3/2000

* cited by examiner

Primary Examiner—Robert Pascal
Assistant Examiner—Barbara Summons
(74) Attorney, Agent, or Firm—Venable; Robert J. Frank

(57) ABSTRACT

A surface acoustic wave duplexer of the present invention comprises a first surface acoustic wave filter having a first pass frequency band, a second surface acoustic wave filter having a second pass frequency band lower than the first pass frequency band and including a series arm surface acoustic wave resonator and a parallel arm surface acoustic wave resonator, a multi-layer package substrate including first to third package substrates, electrode pads formed on the first package substrate, a first ground potential pattern formed on the second package substrate, the first ground potential pattern being connected to the electrode pads and extending to a central region of the second package substrate and a second ground potential pattern formed on the third package substrate. One end of the parallel arm surface acoustic wave resonator is connected to ground potential via the electrode pads and the first and second ground potential patterns.

10 Claims, 10 Drawing Sheets

SURFACE ACOUSTIC WAVE DUPLEXER WITH FIRST AND SECOND PACKAGE GROUND PATTERNS

BACKGROUND OF THE INVENTION

1. Field of the Invention

The present invention relates to a Surface Acoustic Wave duplexer (hereinafter referred to as a SAW duplexer) employed in a high frequency Radio Frequency (RF) filter in a Surface Acoustic Wave resonance filter employed in small, portable communication equipment such as portable telephones. This application is a counterpart application of Japanese application Serial Number 157563/2000, filed May 29, 2000, the subject matter of which is incorporated herein by reference.

2. Description of the Related Art

In recent years, the development of small, lightweight portable communication equipment typified by portable telephones etc. has advanced at a dramatic pace. Small, high-performance duplexers equipped with transmission and receiving filters employed by this kind of communication equipment is therefore also being sought. SAW duplexers constructed using SAW filters as small-type duplexers have also been put forward, and have made a substantial contribution regarding reducing the size of portable communication equipment. Rather than being just small, it is desirable for the SAW duplexers to have low pass band insertion loss and substantial attenuation band attenuation. Therefore, with, for example, SAW filters having a ladder-type circuit configuration of SAW duplexers, there has been proposed a configuration where parallel arm SAW resonators and ground potential are connected together using bonding wire. In this configuration a terminal connected to one end of the parallel arm SAW resonator of a SAW filter chip and a ground terminal of the SAW duplexer package are connected using bonding wiring while mounting the SAW filter chip on the SAW duplexer package. In this way, it is possible to provide an inductance component between the SAW filter and the ground potential, and an amount of attenuation within the attenuation band of the frequency characteristics can be ensured while keeping the SAW duplexer small.

However, it becomes more difficult to provide and regulate the inductance component due to the wire bonding as the device itself for the SAW duplexer, etc., becomes smaller. In particular, taking into consideration the influence of ensuring and regulating the inductance component for a SAW filter having a low-band side pass frequency band, technology for ensuring and regulating a desired inductance component for a SAW filter while keeping the SAW duplexer package itself as small as possible is desired where the frequency characteristics of the SAW duplexer are improved.

SUMMARY OF THE INVENTION

The object of the present invention is to bring about a small SAW duplexer while improving frequency characteristics of a SAW duplexer.

In order to achieve the aforementioned object, a surface acoustic wave duplexer of the present invention comprises a first surface acoustic wave filter having a first pass frequency band region, a second surface acoustic wave filter having a second pass frequency band lower than the first pass frequency band and including a series arm surface acoustic wave resonator and a parallel arm surface acoustic wave resonator, a multi-layer package substrate including first to third package substrates, electrode pads formed on the first package substrate, a first ground potential pattern formed on the second package substrate, the first ground pattern being connected to the electrode pads and extending to a central region of the second package substrate and a second ground potential pattern formed on the third package substrate. One end of the parallel arm surface acoustic wave resonator is connected to ground potential via the electrode pads and the first and second ground potential patterns.

DETAILED DESCRIPTION OF THE INVENTION

The following is a description, with reference to the drawings, of the embodiments of the present invention.

Figure 1:
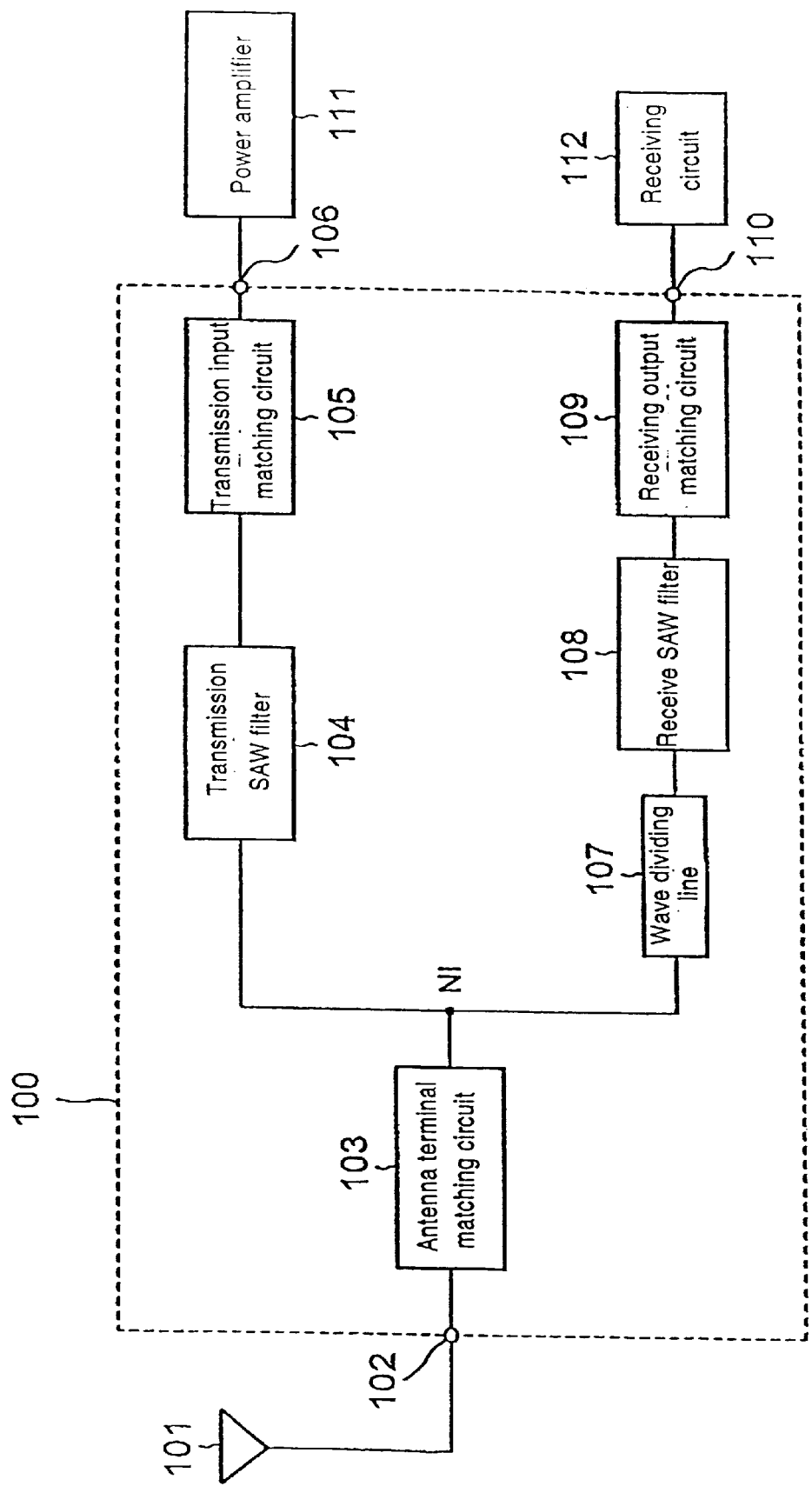
FIG. 1 is a block diagram showing an outline of an example configuration of a SAW duplexer of a first embodiment of the present invention.
Figure 2:
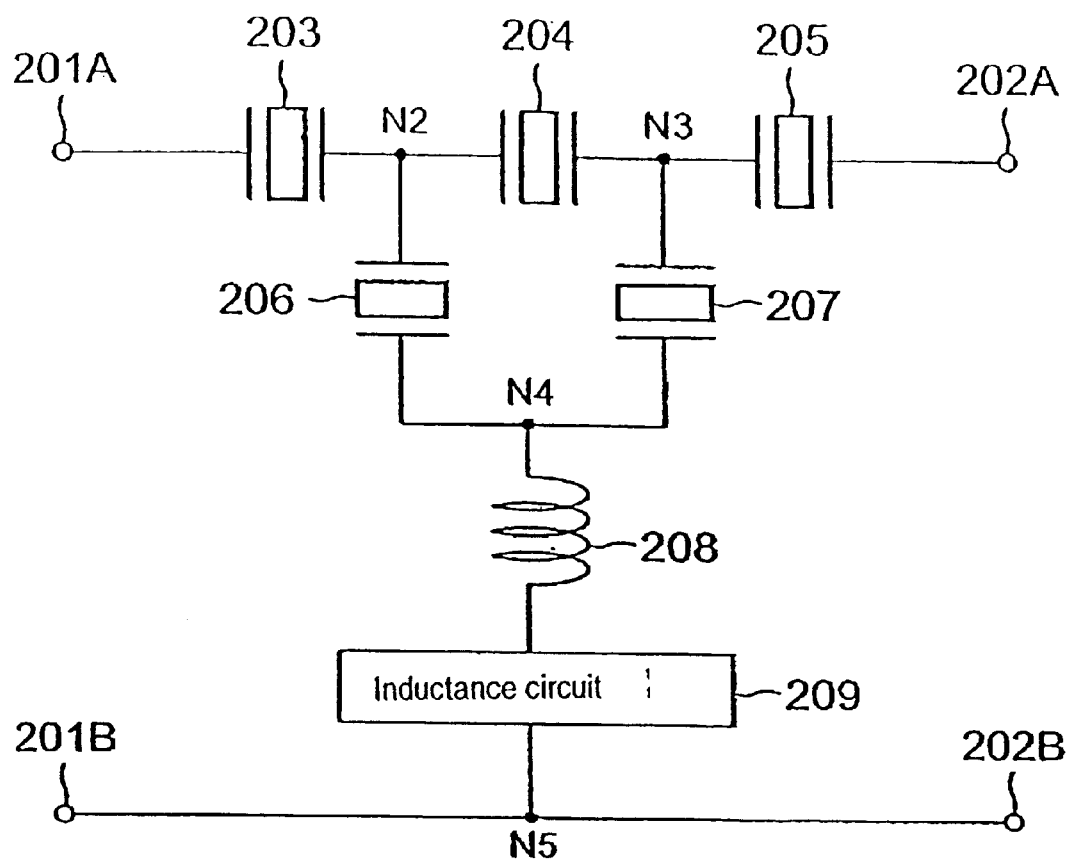
FIG. 2 is a view showing a configuration of a circuit for a SAW filter for transmission use having a low-band side pass frequency band of the first embodiment of the present invention.

First, a description is given of a SAW duplexer of a first embodiment of the present invention. FIG. 1 is a block diagram showing an outline of an example configuration of a SAW duplexer of a first embodiment of the present invention. A SAW duplexer 100 of the present invention comprises an antenna terminal matching circuit 103, a transmission SAW filter 104, a transmission input matching circuit 105, a wave dividing line 107, a receive SAW filter 108, and a receiving output matching circuit 109. The antenna terminal matching circuit 103 is connected across an antenna terminal 102 and a node N1. The transmission SAW filter 104 and the transmission input matching circuit 105 are connected across the node Ni and a transmission terminal 106. On the other hand, the wave dividing line 107, receive SAW filter 108, and receiving output matching circuit 109 are connected across the node N1 and a receiving terminal 110. When the SAW duplexer is incorporated into portable communication equipment such as portable telephones, a power amplifier 111 is connected to the transmission terminal 106 and a receiving circuit 112 is connected to the receiving terminal 110. As an example, a circuit configuration for a transmission SAW filter 104, being one of two SAW filters (the transmission SAW filter 104 and a receive SAW filter 108) having different pass frequency bands, is shown in FIG. 2. Specifically, the transmission SAW filter 104 has a second pass frequency band lower than the first pass frequency band of the receive SAW filter 108.

In FIG. 2, which illustrates the circuits of the SAW filters 104 and 108, series arm SAW resonators 203 to 205 are connected in series across input terminals 201A and 201B, and output terminals 202A and 202B. A parallel arm SAW resonator 206 is connected across a node N2 and node N4 across the series arm SAW resonators 203 and 204, and a parallel arm SAW resonator 207 is connected across a node N3 and node N4 between the series arm SAW resonators 204 and 205. An inductance circuit 208 and an inductance circuit 209 which is formed at the SAW duplexer package as a feature of the present invention are connected using bonding wire across the node N4 and a node N5.

The structure of the inductance circuit 209 that is a main feature of the present invention is now described together with the SAW duplexer 100 and the SAW duplexer package structure, using FIG. 3A, FIG. 3B, FIG. 4A and FIG. 4B.

Figure 3A:
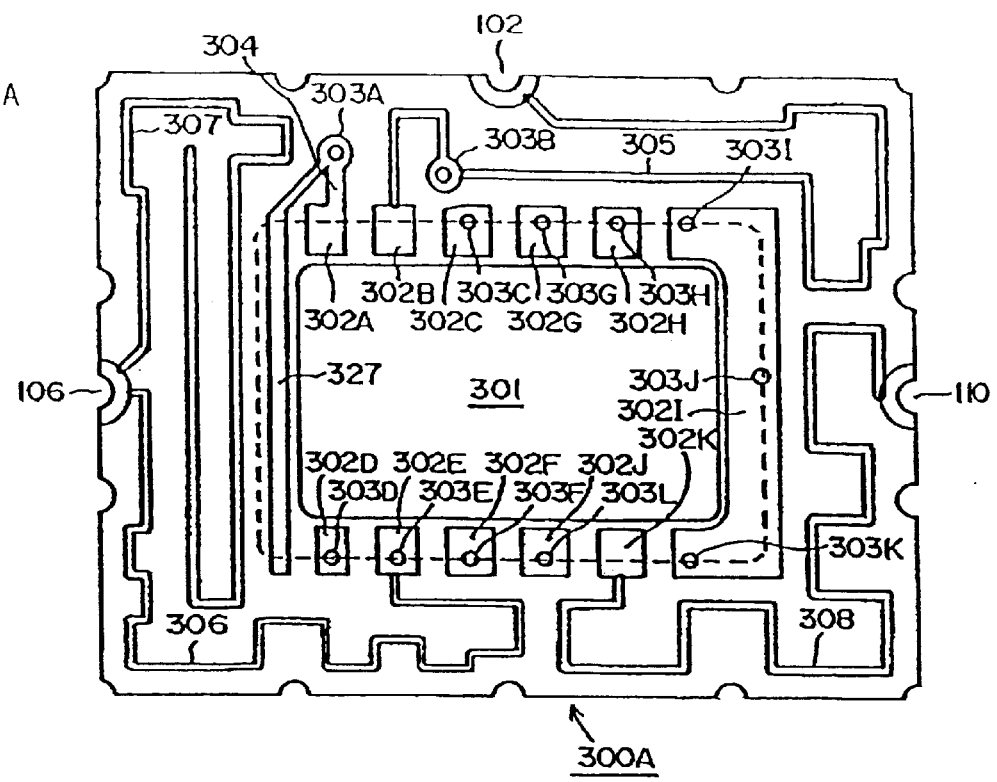
FIG. 3A and FIG. 3B are plan views of a SAW duplexer package substrate of the first embodiment of the present invention.
Figure 3B:
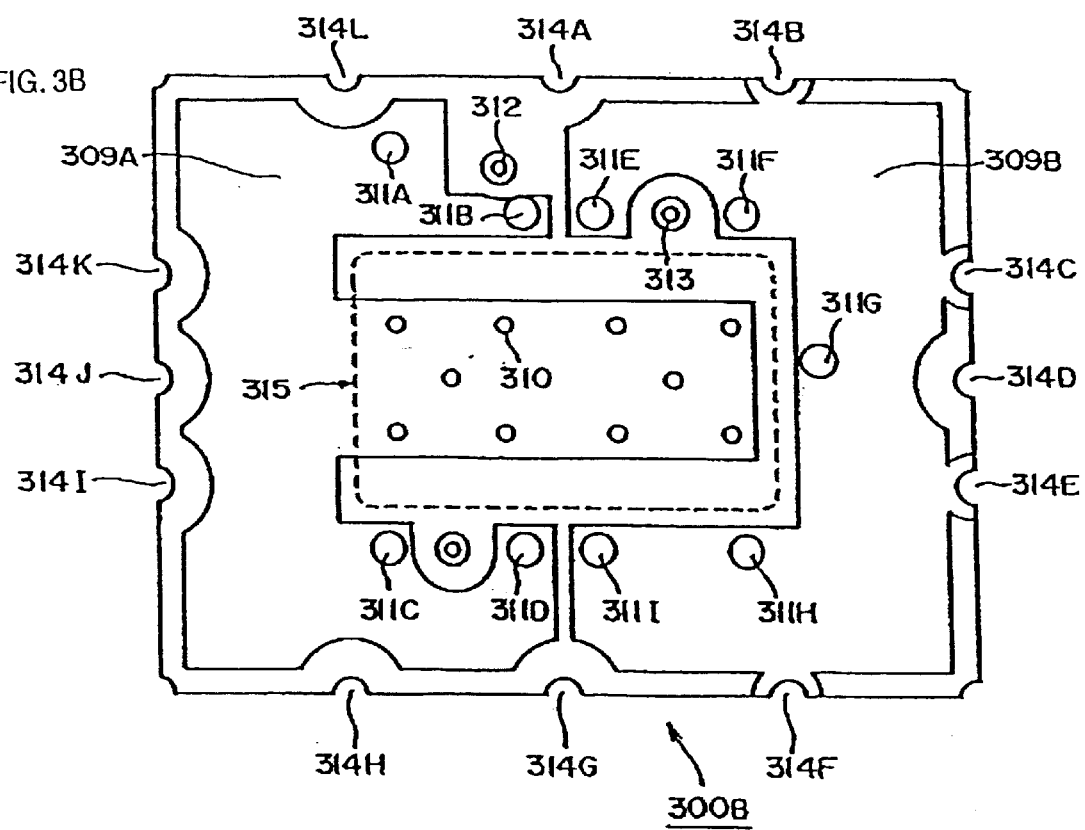
Figure 4A:
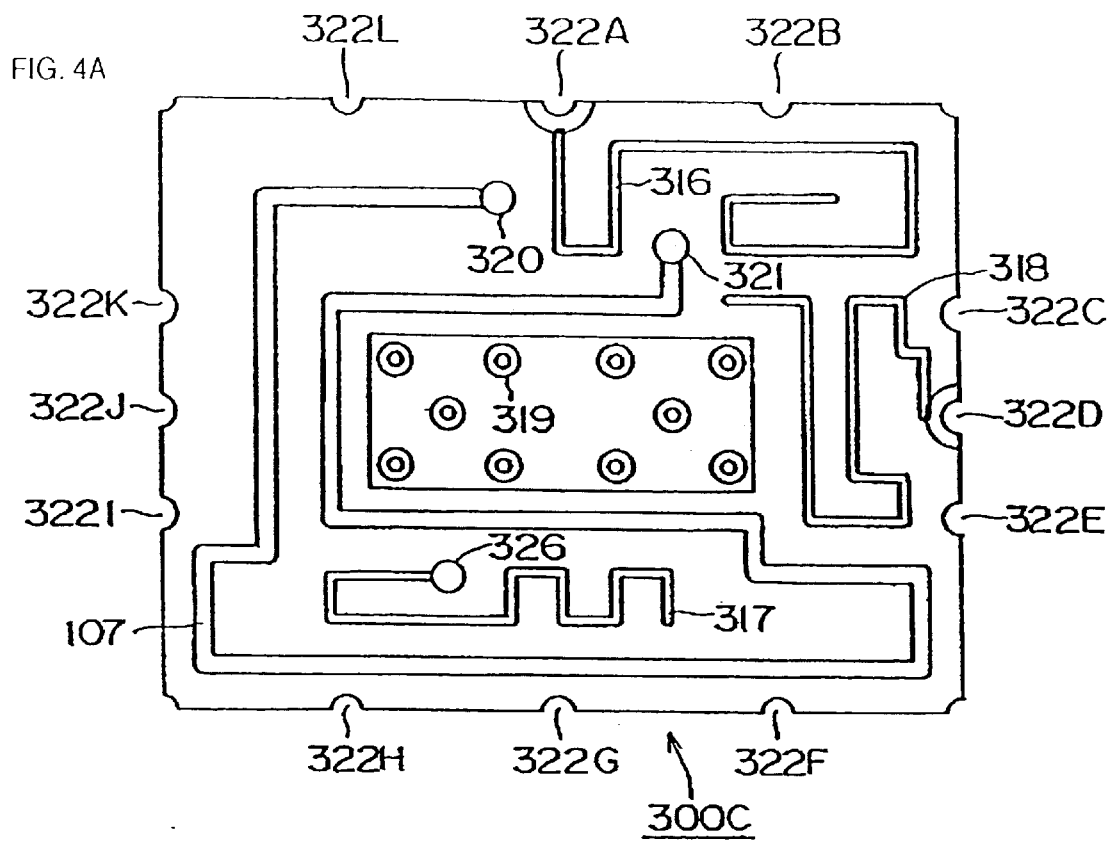
FIG. 4A and FIG. 4B are plan views of a SAW duplexer package substrate of the first embodiment of the present invention.
Figure 4B:
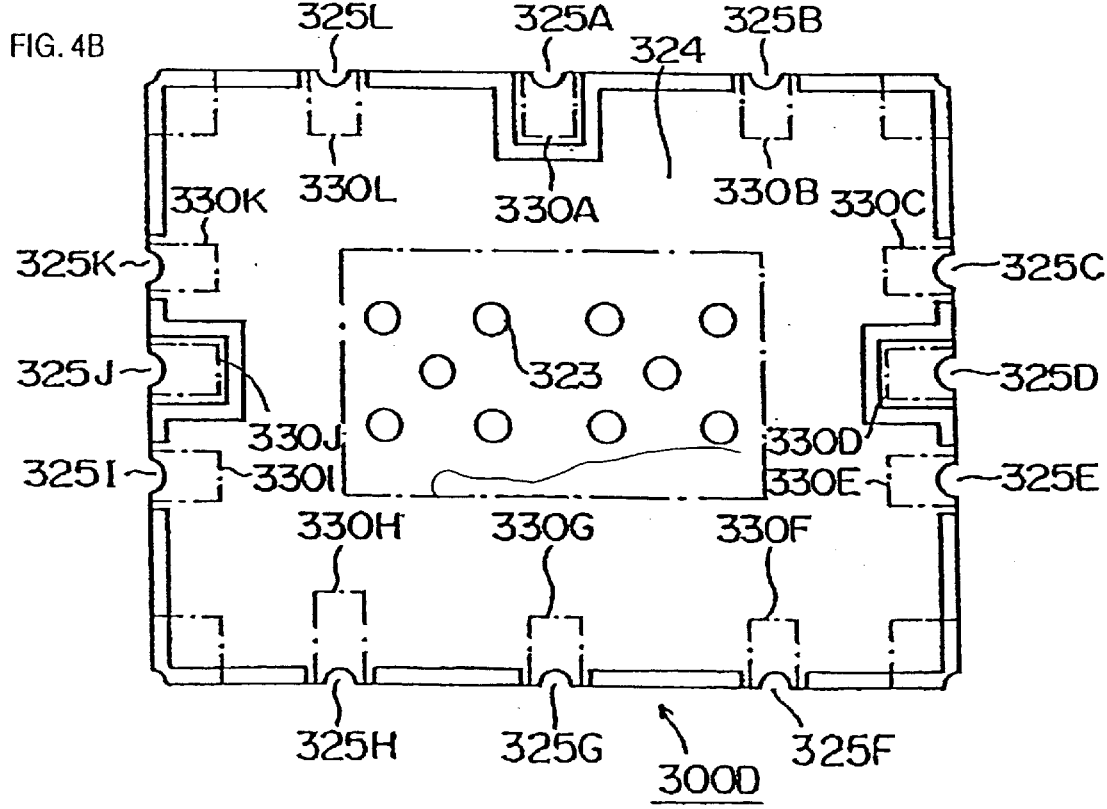
Figure 10A:
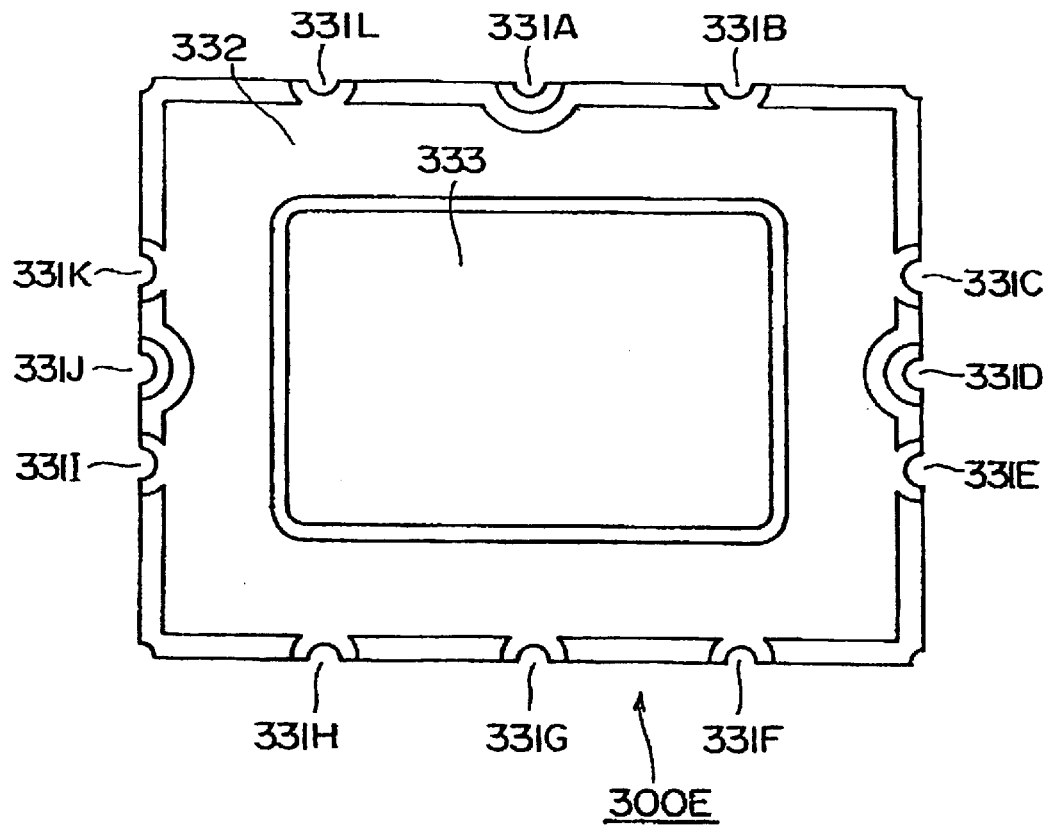
FIG. 10A and FIG. 10B are plan views of a SAW duplexer package substrate and a SAW duplexer sealing cap of a second embodiment of the present invention.
Figure 10B:
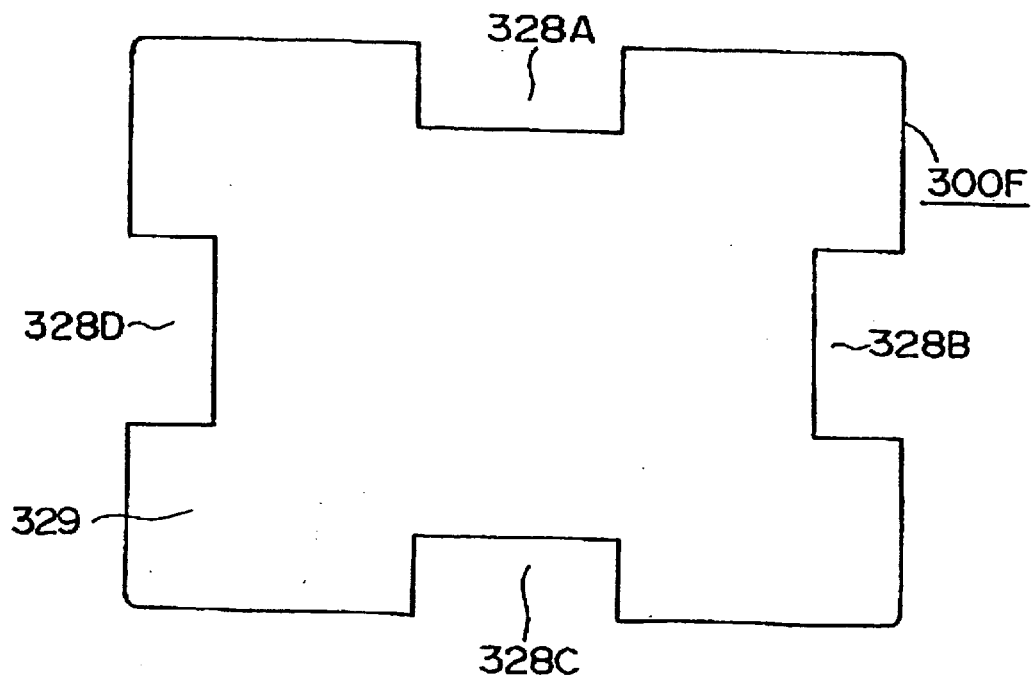

FIG. 3A, FIG. 3B, FIG. 4A and FIG. 4B are plan views of a SAW duplexer package substrate having a multi-layer structure for mounting the transmission SAW filter 104 and the receive SAW filter 108. Each package substrate (first to fourth package substrates) on which the transmission input matching circuit 105, wave dividing line 107, and receiving output matching circuit 109, etc., are formed within the SAW duplexer package substrate having the multi-layer structure of the present invention is described in FIGS. 3A and 3B and FIGS. 4A and 4B. At the SAW duplexer package substrate, a fourth package substrate 300D shown in FIG. 4B is taken as the lowermost layer, with a third package substrate 300C shown in FIG. 4A, a second package substrate 300B shown in FIG. 3B and a first package substrate 300A shown in FIG. 3A sequentially laid on top of each other in that order. As shown in FIG. 10A and FIG. 10B, a fifth package substrate 300E and a sealing cap 300F for sealing the SAW filter chip (SAW filter for transmission and SAW filter for receiving) are formed as a layer on the first package substrate 300A. A description of the structures of the fifth package substrate 300E and the sealing cap 300F is given in the second embodiment.

As shown in FIG. 3A, a cavity (opening) 301 for building-in the SAW filter chip is provided at a central part of the first package substrate 300A. Electrode pads 302A to 302K are formed at the periphery of the cavity 301 in order to connect the SAW filter chip and the SAW duplexer package. Electrode pads 302A to 302F are connected to the transmission SAW filter 104 and electrode pads 302G to 302K are connected to the receive SAW filter 108. Through-holes 303C to 303L for obtaining a connection with the second package substrate 300B are formed at the electrode pads 302C to 302J. A stripline 304 is formed so as to connect with the electrode pad 302A, with a through-hole 303A, described later, for obtaining a connection with a ground potential pattern 309A formed on the second package substrate 300B being formed midway.

A stripline 305 corresponding to the antenna terminal matching circuit 103 is formed across an electrode pad 302B and the antenna terminal 102 so as to function as a matching circuit having inductance. A through-hole 303B for obtaining a connection with the wave dividing line 107, provided at the third package substrate 300C (described later) is provided midway along the stripline 305. This through-hole 303B corresponds to the node N1 of the block diagram of the SAW duplexer shown in FIG. 1. A stripline 306 is provided as an inductance component between the electrode pad 303E and the transmission terminal 106. An open stub 307 having a capacitance component is connected to the transmission terminal 106. A through-hole 303E for obtaining a connection with the open stub 317 formed on the third package substrate 300C (described later) is formed at the electrode pad 302E. A stripline 308 constituting part of the receiving output matching circuit having an inductance component is provided between the electrode pad 302K and the receiving terminal 110.

Next, a description is given of the structure of the second package substrate 300B with reference to FIG. 3B. Interconnecting terminals, 314A, 314D and 314G–314L, and grounded terminals, 314B, 314C, 314E and 314F, are formed at the periphery of the second package substrate 300B. Ground potential patterns 309A and 309B are then formed on the second package substrate 300B. The ground potential pattern 309A is formed in such a manner as to not connect with interconnecting terminals, 314A, 314D and 314G–314L, and grounded terminals, 314B, 314C, 314E and 314F and to extend into a region 315 for mounting the SAW filter chips. A plurality of through-holes 310 for obtaining connections with the fourth package substrate 300D via the third package substrate 300C are formed the extended region 315. Connection points 311 A to 311D existing in a region other than the extended region 315 of the ground potential pattern 309A are provided for connecting with the through-holes 303A, 303C, 303D and 303F formed in the first package substrate 300A. On the other hand, the ground potential pattern 309B is connected to the grounded terminals 314B and 314C, and 314E and 314F. Connection points 311E to 311I on the ground potential pattern 309B are for obtaining connections with the through-holes 303G, 303I to 303K, and 303L formed on the first package substrate 300A. At the second package substrate 300B, through-holes 312 and 313 for obtaining connections with the wave dividing line 107 on the third package substrate 300C are formed at a region other than the region formed with the ground potential patterns 309A and 309B.

Next, a description is given of a structure for the third package substrate 300C with reference to FIG. 4A. Interconnecting terminals 322B, 322C and 322E-L, and stub connected terminals, 322A and 322D, are formed about the periphery of the third package substrate 300C. Connection points 320 and 321 on the third package substrate 300C are for connecting with the stripline 305 and the electrode pad 302H, respectively, on the first package substrate 300A. The wave dividing line 107 is provided in such a manner as to provide a connection between the connection points 320 and 321. The stub connected terminal 322A is employed as the antenna terminal 102 and an open stub 316 having a capacitance component is connected to the stub connected terminal 322A. The stub connected terminal 322D is employed as the receiving terminal and an open stub 318 having a capacitance component is connected to the stub connected terminal 322D. An open stub 317 is connected to connection point 326 of the third package substrate 300C. The interconnecting terminals 322B, 322C, 322E and 322F are connected to the ground potential pattern 309B via the grounded terminals 314B, 314C, 314E and 314F as a result of being painted at side surface portions with an electrically conductive substance.

Finally, a description is given, with reference to FIG. 4B, of the structure of the fourth package substrate 300D.

Interconnecting terminals, 325A, 325D and 325J, and grounded terminals, 325B, 325C, 325E–I, 325K and 325L, are formed about the periphery of the fourth package substrate 300D. Pads 330A to 330L are provided at a region in the vicinity of the interconnecting terminals, 325A, 325D and 325J, and grounded terminals, 325B, 325C, 325E-I, 325K and 325L. A ground potential pattern 324 runs along substantially the whole surface of the fourth package substrate 300D and connects to the grounded terminals 325B and 325C, 325E to 325I, and 325K and 325L. A plurality of through-holes 323 capable of connecting the ground potential pattern 309A on the second package substrate 300B and the ground potential pattern 324 of the fourth package substrate 300D are provided at a central region of the fourth package substrate 300D. The ground potential pattern 309B of the second package substrate 300B is connected to the ground potential pattern 324 via electrically conductive material applied to side surface portions of the grounded terminals 325B and 325C, 325E and 325F of the fourth package substrate 300D, grounded terminals 314B and 314C, and 314E and 314F of the second package substrate 300B, and interconnecting terminals 322B and 322C, 322E and 322F of the third package substrate 300C. The interconnecting terminals 325A, 325D and 325J are terminals used as the antenna terminal 102, the receiving terminal 110 and the transmission terminal 106, respectively.

The following is a description of the SAW duplexer 100 where the first to fourth package substrates are laid one on top of the other and a SAW filter is mounted within a cavity.

First, a description is given of a configuration for inductance circuits 208 and 209 connected across the parallel arm SAW resonators 206 and 207 of FIG. 2. A SAW filter chip is mounted on the extended region 315 of a ground potential pattern of the second package substrate 300B within a cavity 301 of the first package substrate 300A. The node N4 where the parallel arm SAW resonators 206 and 207 of the SAW filter (in this embodiment, the transmission SAW filter 104) having a pass frequency band on the low band side of the SAW filter are connected, and the electrode pads 302C and 302F of the first package substrate 300A are connected, using bonding wire. The inductance circuit 208 having an inductance due to the bonding wire is therefore formed across the node N4 and the ground potential.

The electrode pads 302C and 302F are therefore connected to ground potential via, in order, the through-holes 303C and 303F, the ground potential pattern 309A of the second package substrate 300B, the plurality of through-holes 310, the ground potential pattern 324 formed on the fourth package substrate 300D, and the grounded terminals 325B and 325C, 325E to 325I, 325K and 325L taken as ground terminals, i.e. the ground potential pattern 309A on the second package substrate 300B is connected to ground potential via the plurality of through-holes 310 formed at central regions of the second and third package substrates 300B and 300C and the ground potential pattern 324, rather than via the interconnecting terminals, 314A, 314D, 314G–314L, and grounded terminals, 314B, 314C, 314E and 314F at the periphery of the second package substrate 300B. As a result, the distance from the wirebonded electrode pads 302C and 302F to ground potential can be made as large as possible and a new inductance circuit 209, which is separate from the inductance circuit 208 and has an inductance component, can therefore be added across the node N4 at transmission SAW filter 104 and ground potential.

Figure 8:
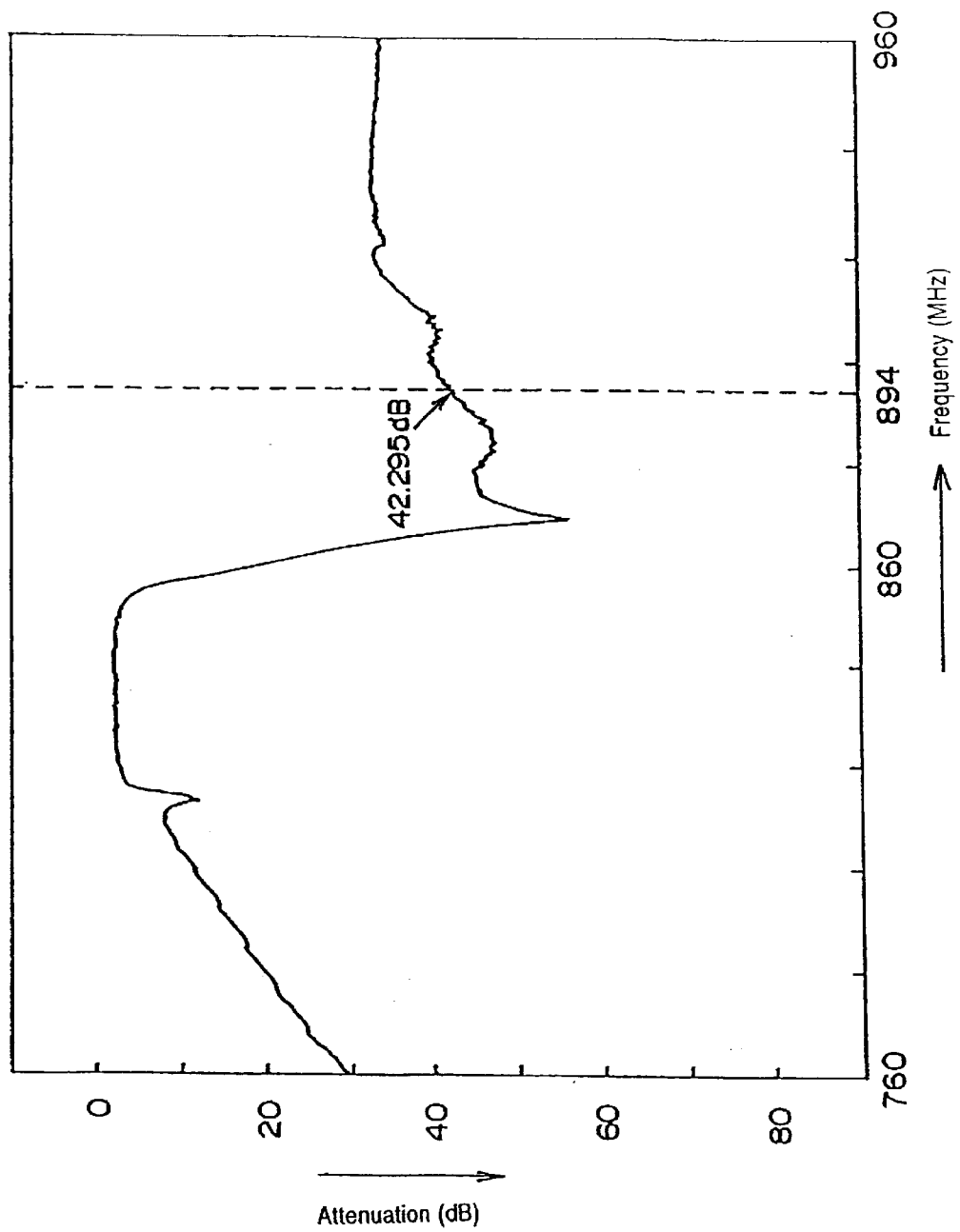
FIG. 8 is a view showing frequency characteristics of a SAW duplexer relating to the present invention.
Figure 9:
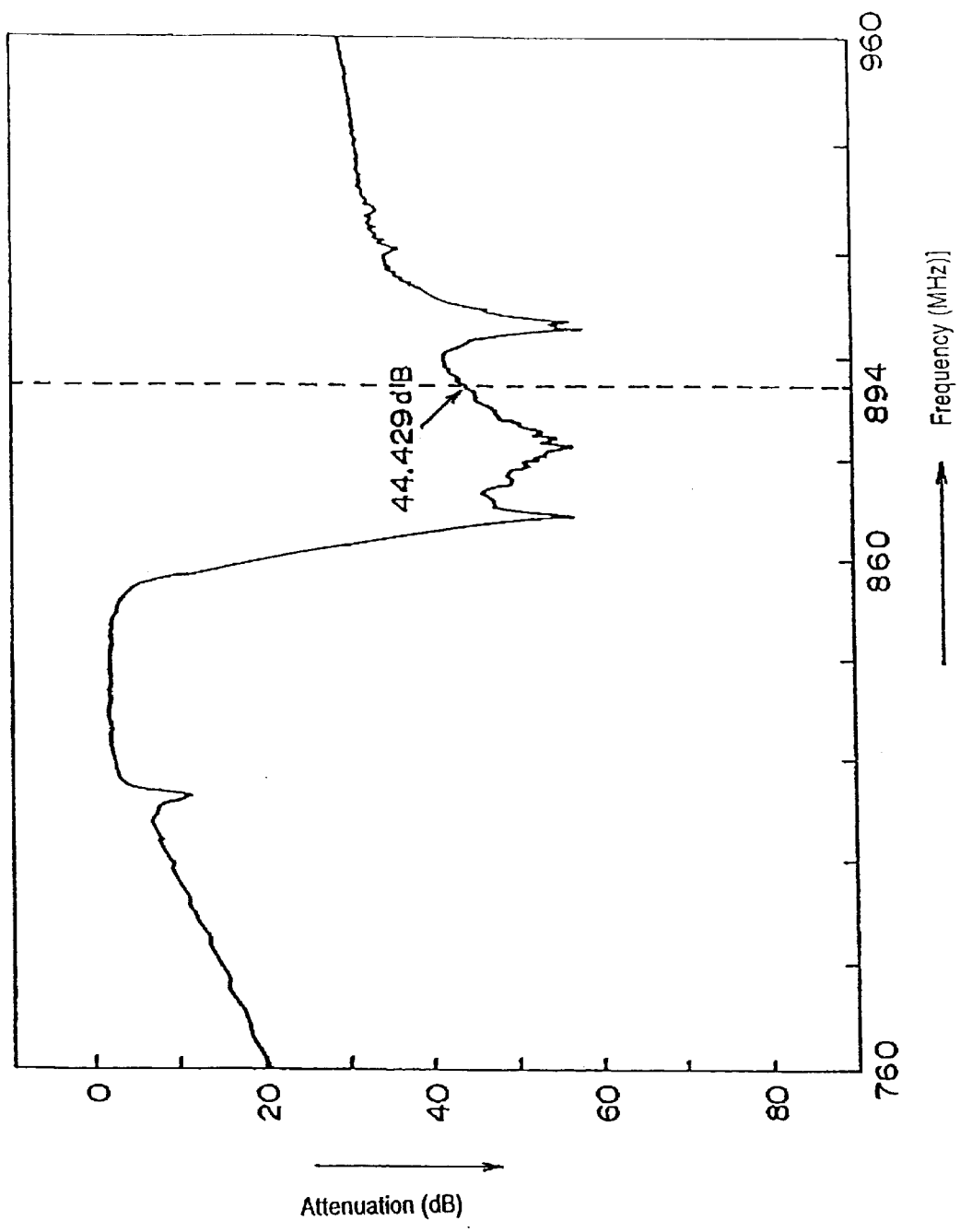
FIG. 9 is a view showing frequency characteristics of a SAW duplexer of the first embodiment of the present invention.

A comparison of frequency characteristics of the transmission SAW filter 104 of the SAW duplexer 100 equipped with the inductance circuit 209 of the above configuration and the frequency characteristics of a SAW filter for transmission of a related SAW duplexer is described in the following. FIG. 8 is a view showing the frequency characteristics of a SAW filter for transmission of a related SAW duplexer, and FIG. 9 is a view showing the frequency characteristics of the transmission SAW filter 104 of the SAW duplexer of the first embodiment of the present invention. In FIG. 8 and FIG. 9, the horizontal axis denotes frequency (MHz) and the vertical axis denotes attenuation (dB). Comparing the frequency characteristics of FIG. 8 and FIG. 9, it can be seen that, at the high-band side attenuation region (where the frequency is approximately 870 MHz to 920 MHz) of the transmission SAW filter, i.e. the pass band of the receive SAW filter, attenuation is larger for the transmission SAW filter 104 of the first embodiment of the present invention. For example, looking at the attenuation when the frequency is 894 MHz, the attenuation for the related SAW filter for transmission is 42.295 dB but the attenuation for the transmission SAW filter 104 of the first embodiment of the present invention is 44.429 dB, giving an increase in attenuation of 2.134 dB as a result of providing the inductance circuit 209.

In the present invention, a micro-stripline 327 is provided from the electrode pad 302A via the through-hole 303A, and this micro-stripline 327 runs, for example, along a side of the cavity 301 and has a width of approximately 0.2 mm. It is therefore possible to connect bonding wire connecting the transmission SAW filter 104 and the first package substrate 300A to a desired position on the micro-stripline 327 rather than to the electrode pad 302C or the electrode pad 302F. It is therefore possible to adjust the magnitude of the inductance component possessed by the inductance circuit 209 to give the desired SAW component characteristic because this depends on which position on the micro-stripline 327 the bonding wire is connected at. In the present invention, it is possible to regulate a composite inductance value of the inductance circuit 209 by increasing or reducing the number of through-holes 310, 319 and 323 provided at the second to fourth package substrates, i.e. the composite inductance value for the inductance circuit 209 becomes smaller when the number of through-holes 310, 319 and 323 is increased, and becomes larger when the number of through-holes 310, 319 and 323 is reduced.

Figure 5:
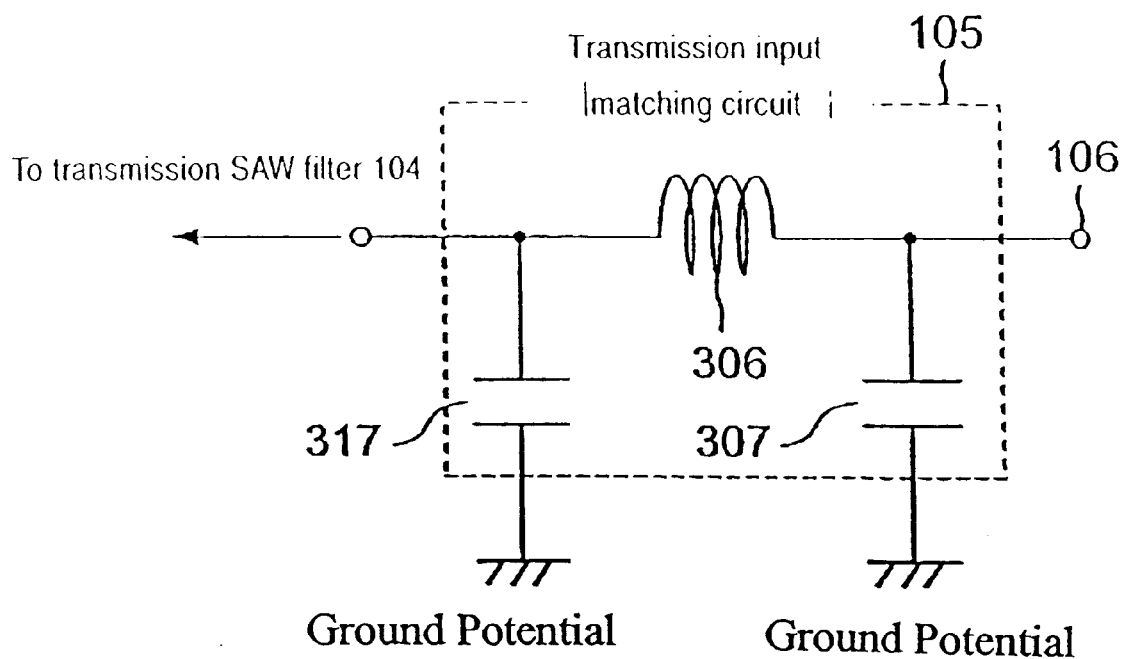
FIG. 5 is a circuit diagram of a transmission input matching circuit of the first embodiment of the present invention.

Next, a description is given of a configuration for the transmission input matching circuit 105 of FIG. 1. The transmission input matching circuit 105 comprises the stripline 306 connected across the transmission terminal 106 and the electrode pad 302E, the open stub 307 connected to the transmission terminal 106, and the open stub 317 connected to the electrode pad 302E via the through-hole 303E. The electrode pad 302E is connected to input terminal 201A of the transmission SAW filter 104 of the SAW filter chip located within the cavity 301. An equivalent circuit for the transmission input matching circuit 105 is then as shown in FIG. 5. Here, an inductance component is formed across the transmission terminal 106 and the transmission SAW filter 104, and the open stubs 307 and 317 form a capacitance component across the strip line 306 and ground potential. The transmission terminal 106 is connected to the interconnecting terminal 325J of the fourth package substrate 300D via conductive material applied to side wall portions of the interconnecting terminal 314J of the second package substrate 300B and the interconnecting terminal 322J of the third package substrate 300C. Solder is then supplied to the interconnecting terminal 325J and pad 330J of the fourth package substrate 300D during mounting of the SAW duplexer on the mounting substrate so that it is possible to connect the transmission terminal 106 of the SAW duplexer to the power amplifier 111 via the mounting substrate.

Figure 6:
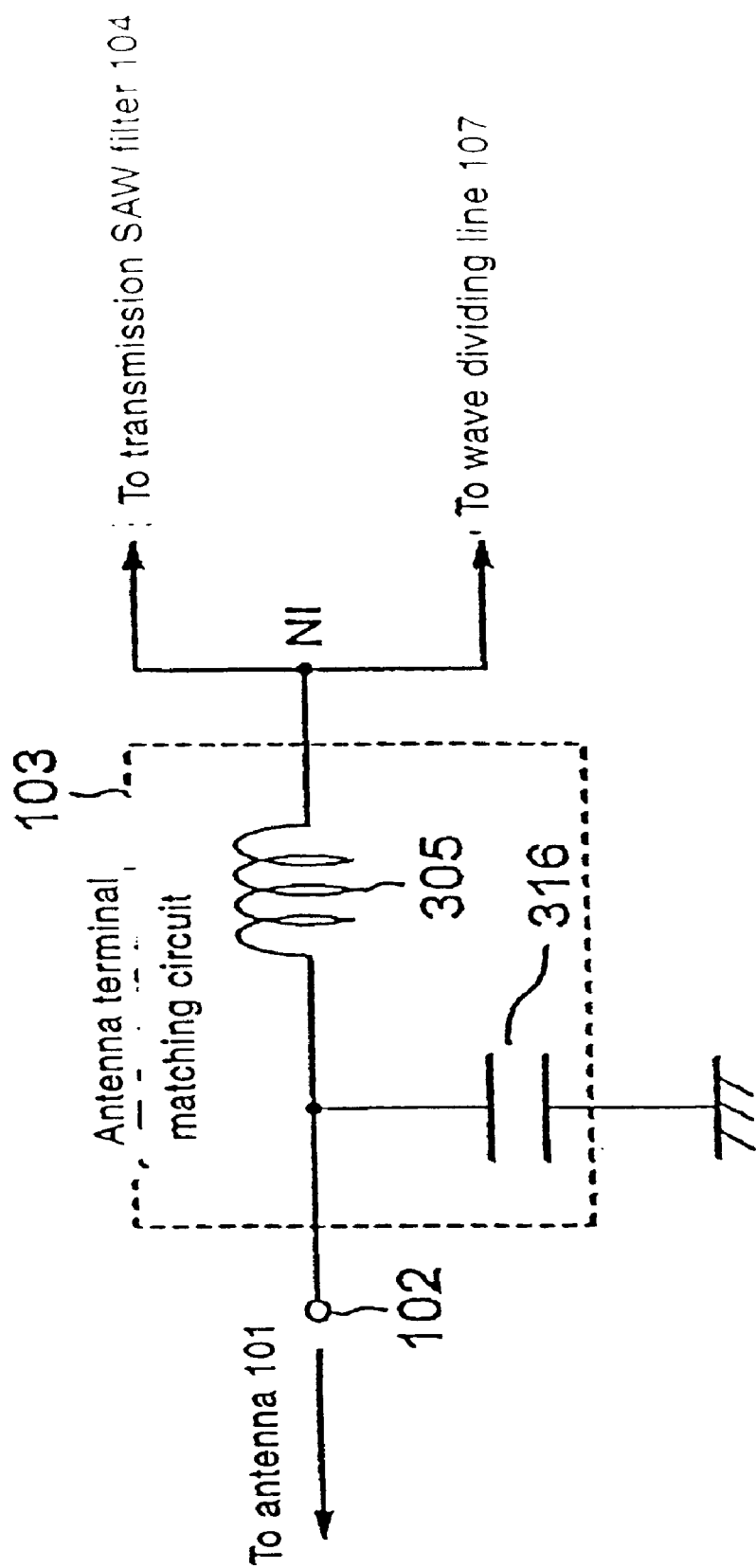
FIG. 6 is a circuit diagram of an antenna terminal matching circuit of the first embodiment of the present invention.

Next, a description is given of a configuration for the antenna terminal matching circuit 103 of FIG. 1. The antenna terminal matching circuit 103 comprises the stripline 305 formed on the first package substrate 300A and the open stub 316 formed on the third package substrate 300C, with the stripline 305 forming the inductance component and the open stub 316 forming the capacitance component. One side of the stripline 305 is connected to the transmission SAW filter 104 via the electrode pad 302B using bonding wire and the other side is connected to the receive SAW filter 108 via the wave dividing line 107 on the third package substrate 300C, the through-hole 303H, the electrode pad 302H and bonding wire, so that the circuit configuration for the antenna terminal matching circuit 103 is as shown in FIG. 6. The antenna terminal 102 is connected to the interconnnecting terminal 325A of the fourth package substrate 300D via electrically conductive material applied to side surface portions of the interconnecting terminal 314A of the second package substrate 300B and the stub connected terminal 322A of the third package substrate 300C.

Figure 7:
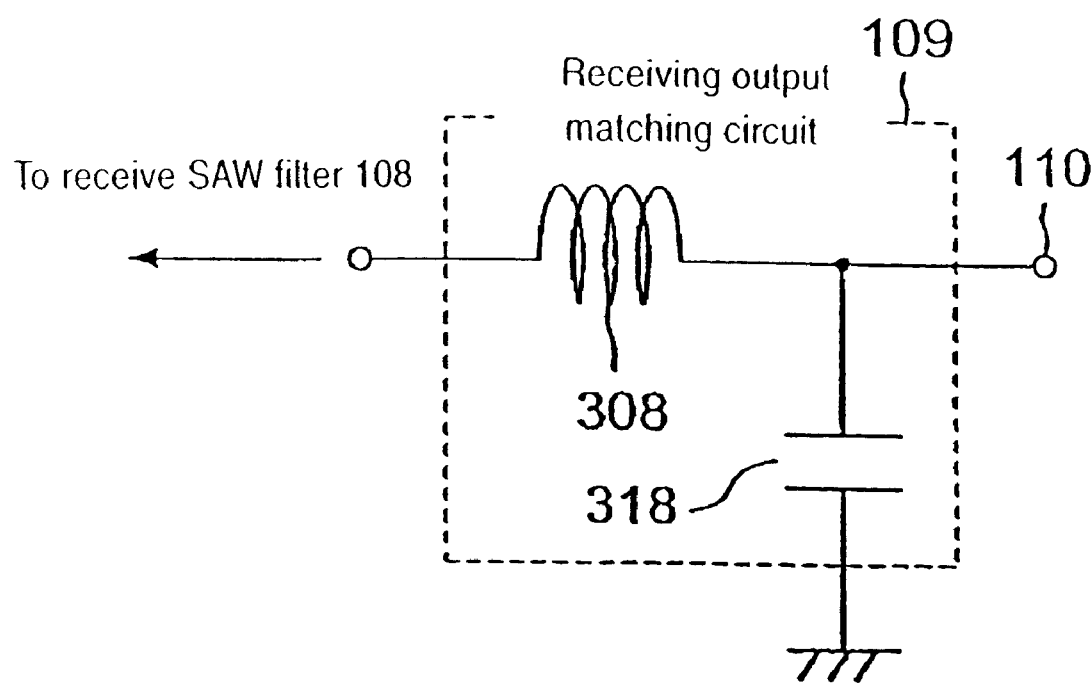
FIG. 7 is a circuit diagram of a receiving output matching circuit of the first embodiment of the present invention.

Next, a description is given of a configuration for the receiving output matching circuit 109 of FIG. 1. The receiving output matching circuit 109 comprises the stripline 308 formed on the first package substrate 300A and the open stub 318 formed on the third package substrate 300C, with the stripline 308 forming the inductance component and the open stub 318 forming the capacitance component, so that the circuit configuration for the receiving output matching circuit 109 is as shown in FIG. 7. The electrode pad 302K to which the stripline 308 is connected is connected to the receive SAW filter 108. The receiving terminal 110 is connected to the interconnecting terminal 325D of the fourth package substrate 300D via electrically conductive material applied to side surface portions of the interconnecting terminal 314D of the second package substrate 300B and the stub connected terminal 322D of the third package substrate 300C. Solder is then supplied to the interconnecting terminal 325D and pad 330D of the fourth package substrate 300D during mounting of the SAW duplexer on the mounting substrate so that it is possible to connect the receiving terminal 110 of the SAW duplexer to the receiving circuit 112 via the mounting substrate.

According to the SAW duplexer of the first embodiment of the present invention, electrode pads 302C and 302F of the first package substrate 300A connected to the parallel arm SAW resonators 206 and 207 within the transmission SAW filter 104 having a low band-side pass frequency band are connected to the ground potential pattern 324 formed on the fourth package substrate 300D via a plurality of through-holes 310 and 319 provided at the second and third package substrates 300B and 300C, and a new inductance circuit 209 can therefore be added at the transmission SAW filter 104. The amount of attenuation at frequencies other than the pass frequency band of the SAW duplexer 100 can therefore be made larger and the frequency characteristics of the SAW duplexer 100 can be improved. Further, by connecting a stripline 327 at the through-hole 303A, bonding wire connections of the parallel arm SAW resonators 206 and 207 within the transmission SAW filter 104 are carried out via the stripline 327 and the inductance value of the inductance circuit 209 can therefore be adjusted using the connection position. This means that it is straightforward to implement a SAW duplexer having the desired frequency characteristics.

Next, a description is given of a SAW duplexer of a second embodiment of the present invention.

With the SAW duplexer of the second embodiment of the present invention, a conductive pattern 329 is formed along substantially the whole of a sealing package substrate of the SAW duplexer of the first embodiment, and this conductive pattern 329 is connected to ground potential.

A structure for a fifth package substrate 300E placed over the first package substrate 300A is shown in FIG. 10A. Interconnecting terminals, 331A, 331D and 331J, and grounded terminals, 331B, 331C, 331E–I, 331K and 331L, are formed about the periphery of the fifth package substrate 300E, and a cavity 333 for building-in a SAW filter chip is provided at the center. A conductive pattern 332 is formed on the fifth package substrate 300E and is connected to the grounded terminals 331B and 331C, 331E to 331I, 331K and 331L.

A sealing cap 300F is placed over the fifth package substrate 300E and the structure of this sealing cap 300F is shown in FIG. 10B. The sealing cap 300F is placed over the first package substrate 300A and worked recesses 328A to 328D for preventing sealing of the antenna terminal 102, transmission terminal 106 and receiving terminal 110 etc., are provided at the periphery of the sealing cap 300F. The sealing cap 300F is located on the fifth package substrate 300E as a result of applying electrically conductive resin onto the fifth package substrate 300E.

The conductive pattern 329 of the sealing cap 300F and the ground potential pattern 324 of the fourth package substrate 300D can then be connected by grounded terminals 325B and 325C, 325E and 325F, 325H and 325I, and 325K and 325L, and electrically conductive material applied to side surface portions of interconnecting terminals of the first to third package substrates 300A to 300C formed in corresponding positions.

It is therefore possible to connect the conductive pattern 329 to ground potential and surround each of the circuits for the transmission and receive SAW filters 104 and 108 within the SAW duplexer 100, the transmission input matching circuit 105, the wave dividing line 107, the receiving output matching circuit 109 and the antenna terminal matching circuit 103 with a conductive pattern which is connected to ground potential. The influence of external signals such as noise etc., on each of the circuits for the transmission and receive SAW filters 104 and 108 within the SAW duplexer 100, the transmission input matching circuit 105, the wave dividing line 107, the receiving output matching circuit 109 and the antenna terminal matching circuit 103 can therefore be suppressed and a superior amount of attenuation can be maintained at frequencies other than the pass frequency band of the SAW duplexer 100.

What is claimed is:

1. A surface acoustic wave duplexer comprising:

a first surface acoustic wave filter having a first pass frequency band;

a second surface wave acoustic filter having a second pass frequency band lower than the first pass frequency band, said second surface wave acoustic filter including a series arm surface acoustic wave resonator and a parallel arm surface acoustic wave resonator;

a multi-layer package substrate including first, second and fourth package substrates;

electrode pads formed on the first package substrate;

a first ground potential pattern formed on the second package substrate, said first ground potential pattern being connected to the electrode pads and extending to a central region of the second package substrate; and a second ground potential pattern formed on the fourth package substrate, one end of the parallel arm surface acoustic wave resonator being connected to ground potential via the electrode pads and the first and second ground potential patterns.

2. The surface acoustic wave duplexer of claim 1 further comprising a first stripline, formed on the first package substrate, and connected to the electrode pads, one end of the parallel arm surface acoustic wave resonator being connected to the first stripline by metal wiring.

3. The surface acoustic wave duplexer of claim 1 further comprising a plurality of through-holes formed in the second package substrate, the first ground potential pattern being connected to the second ground potential pattern via electrically conductive material formed within said plurality of through-holes.

4. The surface acoustic wave duplexer of claim 1 wherein the second ground potential pattern is formed along substantially the entire surface of the fourth package substrate.

5. The surface acoustic wave duplexer of claim 4 further comprising a sealing cap placed over the first package substrate, conductive material being provided substantially across the whole of the sealing cap.

6. The surface acoustic wave duplexer of claim 1, further comprising:

a third package substrate interposed between the second and fourth package substrates;

a second stripline, formed on the first package substrate, and connected to the second surface acoustic wave filter, said second stripline providing an inductance component; and a first open stub, formed on the third package substrate, and connected to the second surface acoustic wave filter, said first open stub providing a capacitance component.

7. The surface acoustic wave duplexer of claim 1, comprising:

a third package substrate interposed between the second and fourth package substrates;

a third stripline, formed on the first package substrate, connected to the first surface acoustic wave filter, said third stripline providing an inductance component; and a second open stub, formed on the third package substrate and connected to the first surface acoustic wave filter, said second open stub providing a capacitance component.

8. The surface acoustic wave duplexer of claim 1, wherein at least one of a stripline and an open stub are formed on at least one of said first and third package substrates for connection to one of said first and second surface acoustic wave filters.

9. The surface acoustic wave duplexer of claim 8, wherein said stripline provides an inductance component.

10. The surface acoustic wave duplexer of claim 8, wherein said open stub provides a capacitance component.

* * * * *